(12) United States Patent
Kanaparthy et al.

(10) Patent No.: US 6,710,440 B2
(45) Date of Patent: Mar. 23, 2004

(54) LOW RESISTANCE CONTACT FOR AN INTEGRATED CIRCUIT

(75) Inventors: Radha R. Kanaparthy, Chandler, AZ (US); Raj Nair, Gilbert, AZ (US); Brent Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/224,892

(22) Filed: Aug. 20, 2002

(65) Prior Publication Data

US 2004/0036521 A1 Feb. 26, 2004

(51) Int. Cl.[7] .............................................. H01L 23/48
(52) U.S. Cl. ....................................... 257/693; 257/741
(58) Field of Search ................................ 257/696, 697, 257/695, 694, 693, 677, 741, 698; 438/679; 439/68, 70, 72, 748, 823

(56) References Cited

U.S. PATENT DOCUMENTS

| | | | | |
|---|---|---|---|---|
| 4,897,708 A | * | 1/1990 | Clements |
| 5,490,040 A | * | 2/1996 | Gaudenzi et al. |
| 5,626,484 A | * | 5/1997 | Okuyama et al. |
| 5,779,492 A | * | 7/1998 | Okuyama et al. |

* cited by examiner

*Primary Examiner*—Sheila V. Clark
(74) *Attorney, Agent, or Firm*—Schwegman, Lundberg, Woessner & Kluth, P.A.

(57) ABSTRACT

An integrated circuit including a die, a first conductor electrically coupled to the die, a second conductor and a conductive liquid that electrically couples the first conductor (e.g., a pin) to the second conductor (e.g., a socket) to lower the resistance between the first conductor and the second conductor.

16 Claims, 5 Drawing Sheets

LOW RESISTANCE CONTACT FOR AN INTEGRATED CIRCUIT

TECHNICAL FIELD

An integrated circuit that includes a low resistance current path, and more particularly, an integrated circuit that includes a conductive liquid to lower resistance between conductors in the integrated circuit.

BACKGROUND

Devices such as processors and application-specific integrated circuits (ASICs) need more power to operate at multiple-gigahertz frequencies and to simultaneously perform the numerous logic and memory operations that are now required of processors. The additional power is supplied by higher currents that generate more heat in, or near, the processor due to resistance along the current path. The additional heat generated by using higher currents can cause processors to operate at temperatures that are high enough to damage the processor.

Current is typically supplied to a processor, or die, through pins that are mounted on an opposite side of a substrate to the die. One way to deal with challenges created by supplying high currents is to add more pins, because a greater number of pins have a larger cumulative cross-sectional area to carry current. The larger cross-sectional area should have a lower resistance that generates less heat when current is supplied to the processor through the pins.

The drawbacks with adding pins include increased cost and the use of precious space on the integrated circuit. In addition, when pins are added, they may not have a significantly lowered resistance as compared to the resistance of the pins in the more active regions of the processor. Therefore, the additional pins may not be effective in reducing resistance in certain current-carrying regions of the integrated circuit.

DETAILED DESCRIPTION

The following detailed description references the accompanying drawings. Like numerals describe substantially similar components throughout each of the drawings. Other embodiments may be used, and structural, logical, and electrical changes made. The embodiments described herein can be manufactured, used, or shipped in a number of positions and orientations.

Figure 1:
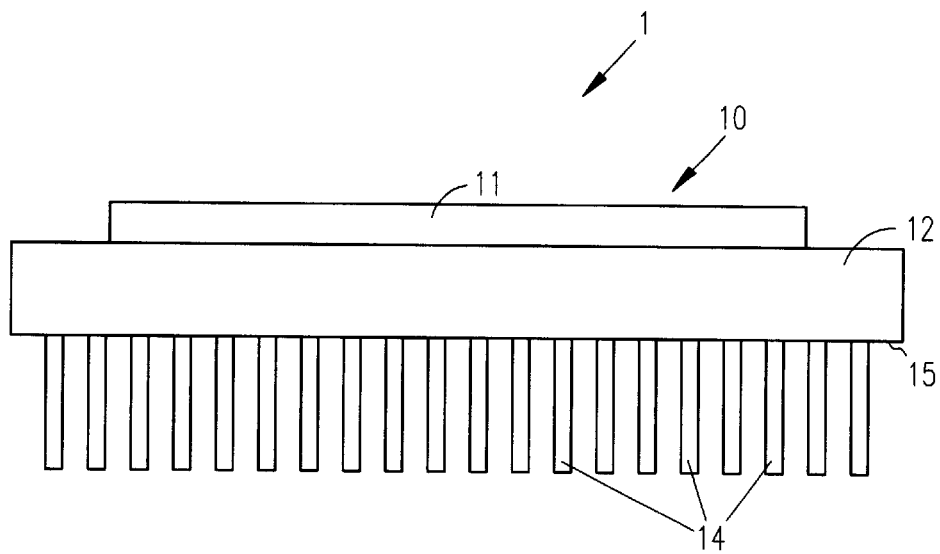
FIG. 1 shows a portion of an integrated circuit that includes a die mounted onto a substrate.

FIG. 1 illustrates a portion 10 of an integrated circuit 1 that includes an electronic device, such as die 11, mounted onto a substrate 12. A first conductor, such as an array of pins 14, is electrically coupled to die 11. Pins 14 are disposed on a side 15 of substrate 12 that is opposite to die 11.

Figure 2:
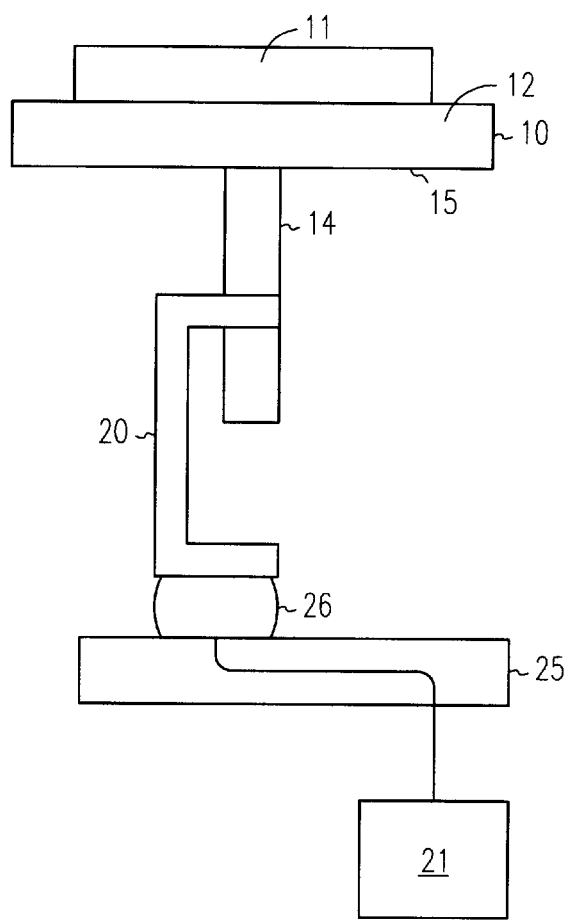
FIG. 2 is a side view illustrating the portion of the integrated circuit of FIG. 1 coupled to a socket mounted onto a substrate.

FIG. 2 illustrates portion 10 mounted to a second conductor, such as socket 20. Socket 20 is secured to a substrate 25 through any conventional means, such as solder balls 26. Socket 20 is electrically coupled to a voltage source 21 through traces in substrate 25, although any combination of leads, wires, vias and/or traces may be used to couple voltage source 21 to socket 20.

Socket 20 is adapted to receive pins 14. Pins 14 may supply power or I/O signals to die 11. The connection between pins 14 and socket 20 can be of any conventional type, including but not limited to, zero-insertion-force, or "ZIF", and low-insertion-force, or "LIF." The first and second conductors may take other forms besides a socket 20 and pin 14 arrangement.

Figure 3:
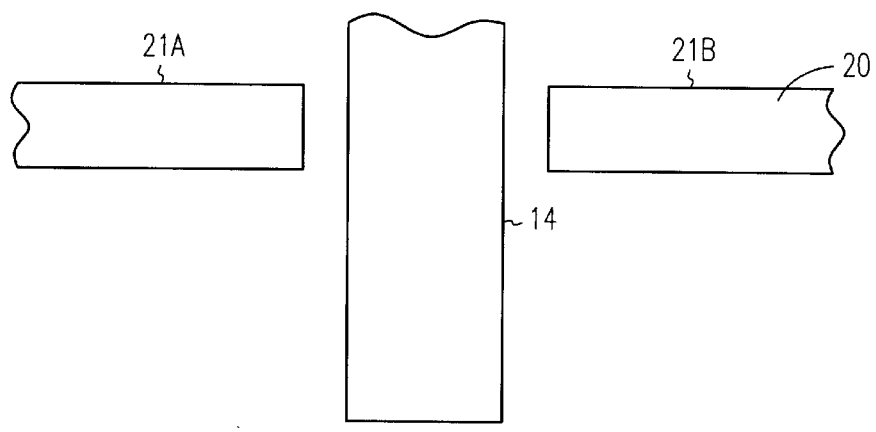
FIG. 3 shows one example pin placed in a socket within the integrated circuit of FIG. 2.
Figure 4:
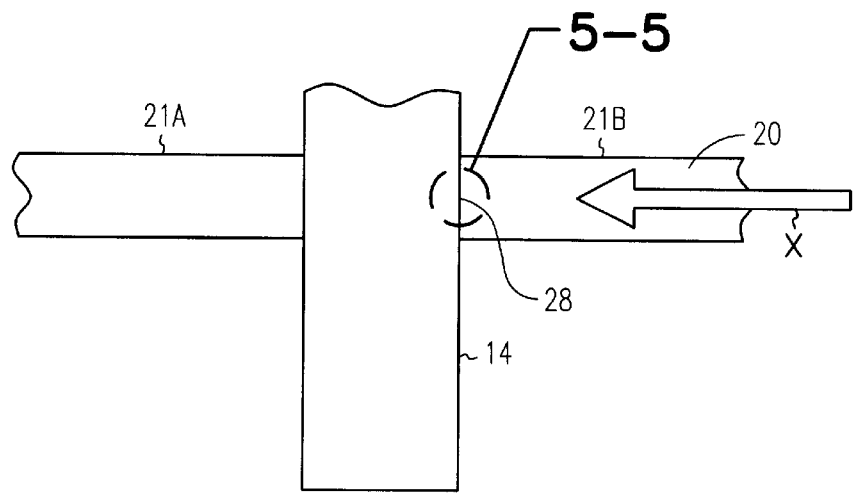
FIG. 4 shows the pin and socket of FIG. 3 secured together.

FIG. 3 shows one example pin 14 after it has been inserted between two portions 21A, 21B of socket 20. FIG. 4 shows pin 14 secured in socket 20 after a force (denoted by arrow X) is applied to compress pin 14 between portions 21A, 21B. In other sample embodiments, pin 14 and socket 20 are configured such that force is required to insert pin 14 into socket 20 thereby placing pin 14 under an immediate compressive force from socket 20.

Figure 5:
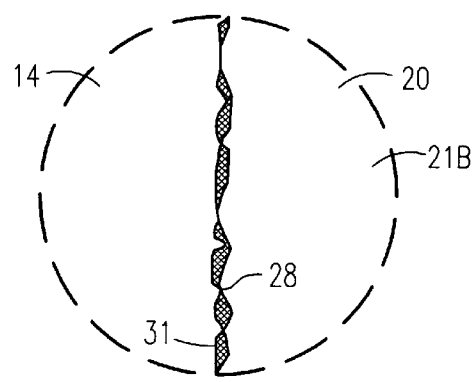
FIG. 5 shows an example magnified contact area between the pin and socket of FIG. 4.

Irregularities on the mating surfaces of pin 14 and portions 21A, 21B result in an imperfect contact area between pin 14 and portions 21A, 21B. FIG. 5 shows an example magnified view of the conductive liquid that fills contact area 28 between portion 21B of socket 20 and pin 14. The imperfect contact area causes a higher than necessary contact resistance between pin 14 and socket 20 such that there is increased heat dissipation within integrated circuit 1, especially with high currents.

Figure 6:
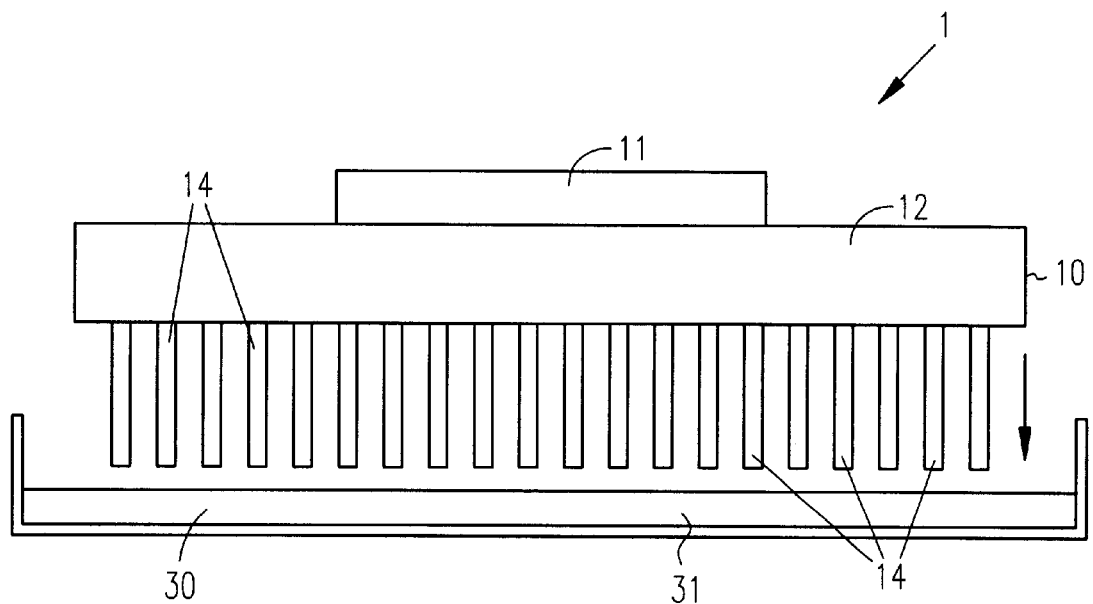
FIG. 6 shows immersing pins on a portion of an integrated circuit into a bath of conductive liquid to coat the pins with the conductive liquid.

FIGS. 6 shows placing pins 14 into a bath 30 of conductive liquid 31 to coat pins 14 with conductive liquid 31. Conductive liquid 31 may be a conductive liquid metal such as gallium or a gallium-based alloy. As used herein, conductive liquid also includes greases, slurries and other viscous materials. One of the factors in determining the appropriate conductive liquid is the material of the first conductor and the second conductor. Another factor will be the operating temperature at the connection between pins 14 and socket 20. The melting point of conductive liquid 31 should be low enough to prevent conductive liquid 31 from solidifying at operating temperatures. In some embodiments, conductive liquid 31 solidifies at room temperature and liquefies below the operating temperature of the junction between pins 14 and socket 20.

Figure 7:
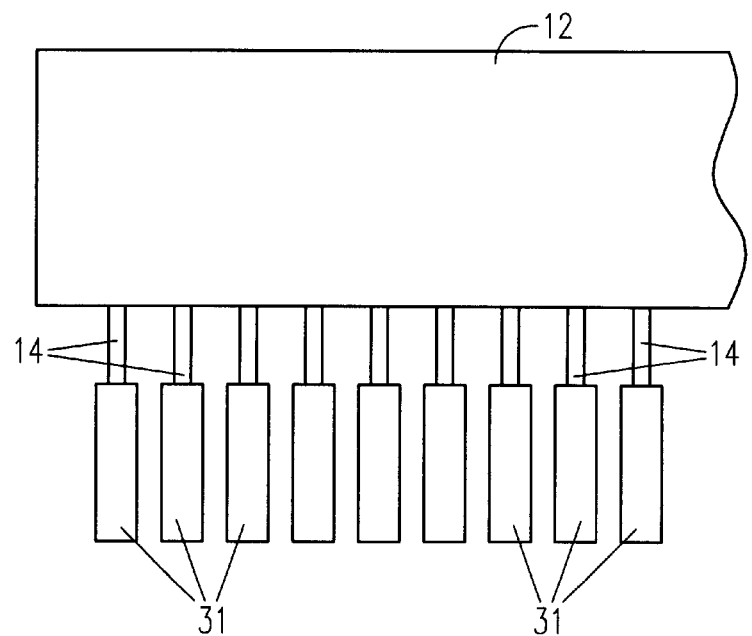
FIG. 7 shows an enlarged portion of the integrated circuit illustrated in FIG. 6 with the pins coated in conductive liquid.

FIG. 7 shows pins 14 after being coated with conductive liquid 31. Although FIG. 7 shows only a portion of pins 14 coated with conductive liquid 31, the entire pins 14 may be coated depending on the connection between pins 14 and socket 20.

Figure 8:
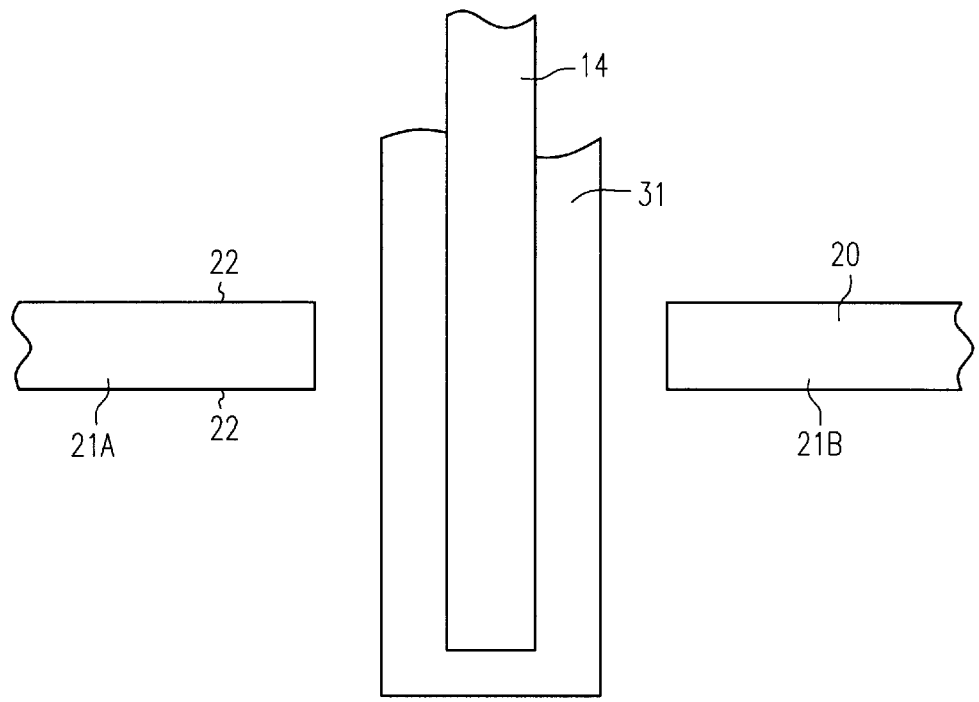
FIG. 8 shows one example coated pin in the portion of the integrated circuit of FIG. 6 placed between portions of a socket.
Figure 9:
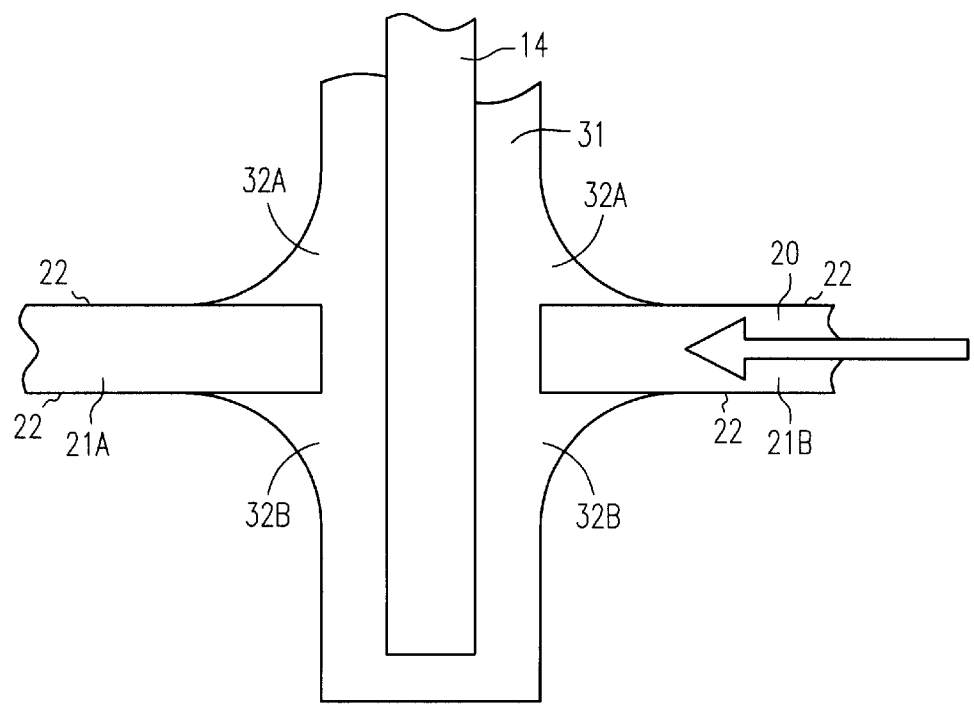
FIG. 9 shows the coated pin of FIG. 8 secured to the socket.

As shown in FIG. 8, pins 14 are coated with conductive liquid 31 and inserted between respective portions 21A, 21B of socket 20 in a similar manner as described above relative to FIG. 3. FIG. 9 shows that when portions 21A, 21B of socket 20 are moved close enough to engage pin 14, conductive liquid 31 fills in the imperfections in the contact area between pin 14 and portions 21A, 21B. Filling in the imperfections in the contact areas between pins 14 and socket 20 reduces the overall contact resistance and minimizes the dependency of the contact resistance on the force that is used to compress pins 14 against socket 20. In some embodiments, the first conductor and the second conductor are electrically isolated without conductive liquid 31, while in other embodiments the first conductor and the second conductor are electrically coupled without conductive liquid 31 with the first conductor compressed against the second conductor.

Depending on the materials of the pins 14, portions 21A, 21B and liquid 31 there is an attraction between conductive liquid 31 and the surfaces 22 on portions 21A, 21B such that conductive liquid 31 "wets" surfaces 22 to form fillets 32A, 32B above and below portions 21A, 21B. The fillets 32A, 32B increase the contact area between pins 14 and socket 20 thereby further lowering the contact resistance between pins 14 and socket 20. In one example embodiment, pins 14 and portions 21A, 21B are gold and conductive liquid 31 is gallium.

Adding conductive liquid 31 provides a low resistance current path as compared to the connection between pins 14 and socket 20 without conductive liquid 31. During operation of integrated circuit 1, current is supplied through the low resistance connection. The low resistance path eliminates or reduces the need for additional pins to carry higher currents, and provides circuit designers with additional real estate for other components, such as extra I/O pins or capacitors. Portion 10 of integrated circuit 1 can be adapted for use with any conventional socket to connect portion 10 to another substrate or some other electronic device, such as a motherboard. Socket 20 is selected by determining the appropriate components based on the space available and the particular electrical situation.

A die is typically made of semiconductive material that has been separated from a wafer after integrated processing. Wafers may be made of semiconducting, non-semiconducting, or combinations of semiconducting and non-semiconducting materials.

FIGS. 1–9 also illustrate a method of connecting a die 11 to a voltage source 21 that includes coating a first conductor, such as pins 14, with a conductive liquid 31 where pins 14 are electrically coupled to die 11. The method further includes electrically connecting pins 14 to a second conductor, such as by insertion of pins 14 into a socket 20, where socket 20 is electrically coupled to voltage source 21.

Electrically connecting pin 14 to socket 20 may include filling in voids in contact area 28 between pin 14 and socket 20 with conductive liquid 31 (see voids in FIG. 5). In some embodiments, the method includes compressing socket 20 against pins 14 and/or coating pins 14 with gallium.

Figure 10:
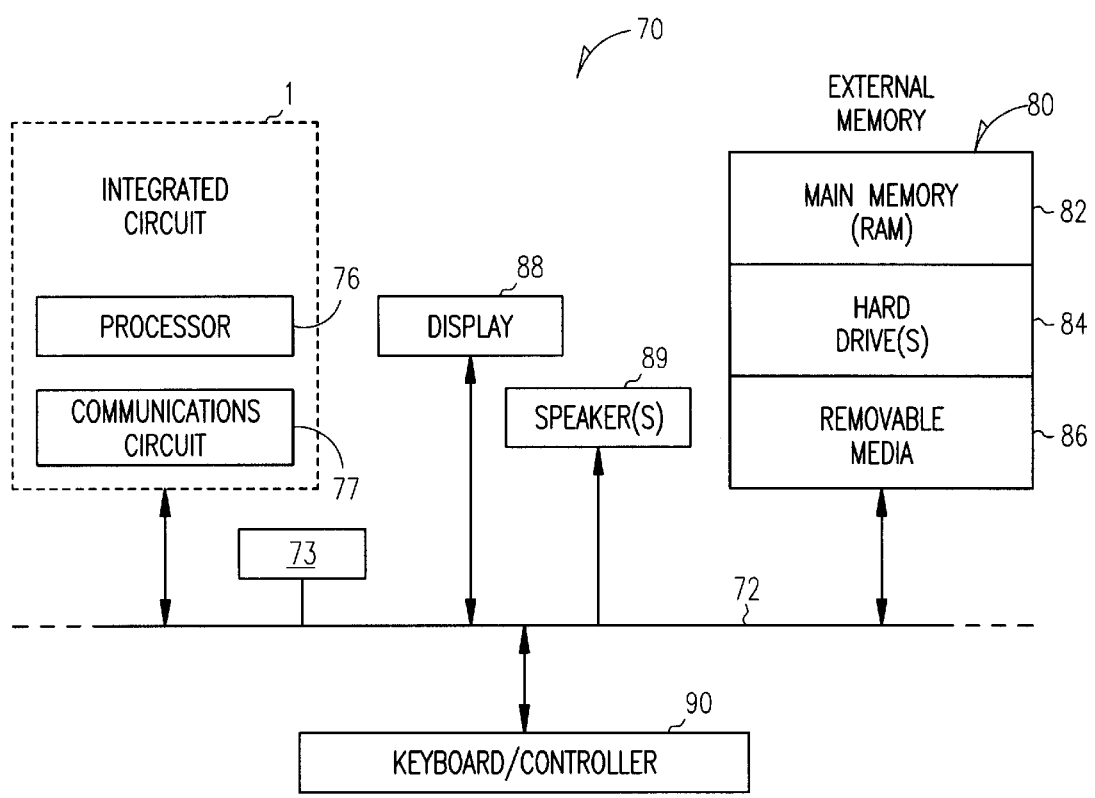
FIG. 10 is a block diagram of an electronic system incorporating at least one integrated circuit that includes the pin and socket connection of FIG. 9.

FIG. 10 is a block diagram of an electronic system 70 incorporating at least one electronic assembly, such as integrated circuit 1. Electronic system 70 may be a computer system that includes a system bus 72 to electrically couple the various components of electronic system 70. System bus 72 may be a single bus or any combination of busses. Electronic system 70 may include a voltage source 73 that provides power to integrated circuit 1. In some embodiments, voltage source 73 supplies current to integrated circuit I through buss 72.

Integrated circuit 1 is coupled to system bus 72 and may include any circuit, or combination of circuits. In one embodiment, integrated circuit 1 includes a die, such as processor 76 which can be of any type. As used herein, processor means any type of circuit such as, but not limited to, a microprocessor, a microcontroller, a graphics processor or a digital signal processor.

Other types of circuits that can be included in integrated circuit 1 are a custom circuit or an application-specific integrated circuit, such as communications circuit 77 for use in wireless devices such as cellular telephones, pagers, portable computers, two-way radios, and similar electronic systems.

The electronic system 70 may also include an external memory 80 that in turn may include one or more memory elements suitable to the particular application, such as a main memory 82 in the form of random access memory (RAM), one or more hard drives 84, and/or one or more drives that handle removable media 86, such as diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 90.

As shown herein, the present invention can be implemented in an electronic package, an electronic system, a computer system, one or more methods of fabricating an electronic package, and one or more methods of fabricating an electronic assembly that includes the package. The elements, materials, geometries, dimensions, and sequence of operations can all be varied to suit particular packaging requirements.

FIGS. 1–10 are merely representational and not drawn to scale. Certain proportions thereof may be exaggerated, especially as to the interface between pins and sockets, while others may be minimized.

The integrated circuit described above provides a solution for integrated circuits that are powered by high currents. The solution supplies designers with a multitude of options for developing integrated circuits that include a high-powered processor. Many other embodiments will be apparent to those of skill in the art from the above description.

What is claimed is:

1. An integrated circuit comprising:
   an electronic device;
   a first conductor electrically coupled to the electronic device;
   a second conductor electrically coupled to the first conductor via an imperfect contact area; and
   a conductive liquid that fills the imperfect contact area between the first conductor and the second conductor to lower the resistance between the first conductor and the second conductor.

2. The integrated circuit of claim 1, wherein the first conductor is a pin.

3. The integrated circuit of claim 1, wherein the second conductor is a socket.

4. The integrated circuit of claim 1, wherein the conductive liquid is a grease.

5. The integrated circuit of claim 1, wherein the electronic device is a die.

6. The integrated circuit of claim 1, wherein the conductive liquid is gallium.

7. The integrated circuit of claim 1, wherein the first conductor is compressed against the second conductor.

8. A method of connecting a die to a voltage source comprising:

coating a first conductor with a conductive liquid, the first conductor being electrically coupled to the die; and electrically connecting the first conductor to a second conductor such that an imperfect contact area is formed between the first conductor and the second conductor and the liquid substantially fills the imperfect contact area, the second conductor being electrically coupled to the voltage source.

9. The method of claim 8, wherein electrically connecting the first conductor to the second conductor includes compressing the second conductor against the first conductor.

10. The method of claim 8, wherein coating the first conductor with a conductive liquid includes coating a pin with the conductive liquid, and electrically connecting the first conductor to a second conductor includes inserting the pin into a socket.

11. A computer system comprising:

a bus;

a memory coupled to the bus;

a voltage source; and an integrated circuit including a die, a first conductor electrically coupled to the die, a second conductor electrically coupled the first conductor via an imperfect contact area, and a conductive liquid that fills the imperfect contact area between the first conductor and the second conductor to lower the resistance between the first conductor and the second conductor, the second conductor being electrically coupled to the voltage source.

12. The computer system of claim 11, wherein the conductive liquid is gallium.

13. The computer system of claim 11, wherein the first conductor is compressed against the second conductor.

14. An integrated circuit comprising:

a die;

a pin electrically coupled to the die;

a socket; and a conductive liquid coated onto the pin to lower resistance between the pin and the socket when the pin is inserted into the socket.

15. The integrated circuit of claim 14, wherein the conductive liquid solidifies at room temperature and liquefies below an operating temperature of a junction between the pin and the socket.

16. The integrated circuit of claim 14, wherein the conductive liquid is a grease.

* * * * *